United States Patent [19]
Hazelton et al.

[11] Patent Number: 6,104,108
[45] Date of Patent: Aug. 15, 2000

[54] WEDGE MAGNET ARRAY FOR LINEAR MOTOR

[75] Inventors: Andrew J. Hazelton, San Carlos; Jean-Marc Gery, Beverly Hills, both of Calif.

[73] Assignee: Nikon Corporation, Japan

[21] Appl. No.: 09/219,545

[22] Filed: Dec. 22, 1998

[51] Int. Cl.$^7$ .................................................. H02K 41/00
[52] U.S. Cl. .............................................. 310/12; 310/42
[58] Field of Search .......................................... 310/12, 42

[56] References Cited

U.S. PATENT DOCUMENTS

| | | | |
|---|---|---|---|
| 5,402,021 | 3/1995 | Johnson | 310/12 |
| 5,477,304 | 12/1995 | Nishi | 355/53 |
| 5,528,118 | 6/1996 | Lee | 318/568.17 |
| 5,715,037 | 2/1998 | Saiki et al. | 355/53 |
| 5,773,837 | 6/1998 | Nakasuji | 250/412.23 |
| 5,907,200 | 5/1999 | Chitayat | 310/12 |

OTHER PUBLICATIONS

Trumper, David et al., "Magnet Arrays For Synchronous Machine", Proc. of IEEE Industry Application Society Annual Meeting Oct. 2–8, 1993 (IEEE CAT93CH3366, vol. 1 or 3 vols.).

Halbach, Klaus, "Design Of Permanent Multipole Magnets With Oriented Rare Earth Cobalt Material", Nuclear Instruments and Methods 169, (1980), pp. 1–10. (month unknown).

Halbach, Klaus, "Physical And Optical Properties Of Rare Earth Cobalt Magnets", Nuclear Instruments and Methods 187, (1981), pp. 109–117. (month unknown).

*Primary Examiner*—Nestor Ramirez
*Assistant Examiner*—Judson H. Jones
*Attorney, Agent, or Firm*—Skjerven, Morrill, MacPherson, Franklin & Friel LLP

[57] ABSTRACT

A linear motor, suitable to drive a photolithography positioning stage, incorporates a magnet array having transverse magnets and wedge magnets. The transverse magnets are spaced at regular intervals along a direction parallel with their magnetic polarities. Each transverse magnet is linked by a closed magnetic flux circuit with two adjacent wedge magnets having magnetic polarities oriented at an angle relative to the transverse magnet polarities. The local flux direction is substantially parallel to the magnetic polarity within each magnet, effectively enhancing magnetic flux density. Magnetic flux circuits are completed directly through the magnets and not through side rails, allowing selection of stronger, lighter-weight nonmagnetic side rail material. Wedge magnets with rectangular and trapezoidal cross-sectional shapes are described. Alternative array configurations contain two rows of complementary transverse and wedge magnets spaced on opposite sides of a coil array. Paired transverse magnets spaced across from one another have opposite polarities.

36 Claims, 5 Drawing Sheets

WEDGE MAGNET ARRAY FOR LINEAR MOTOR

FIELD OF THE INVENTION

This invention relates to motors, and more specifically to magnet arrays for linear motors.

BACKGROUND

Linear motors are described in Hazelton et al. U.S. patent application Ser. No. 09/059,056, filed Apr. 10, 1998, the specification of which is incorporated herein by reference in its entirety, and which is assigned to Nikon Corporation, Assignee of the present application. Linear motors are commonly used, for example, in micro-lithographic instruments for positioning objects such as stages, and in other precision motion devices. A conventional linear motor includes a magnet array, which creates a magnetic field. A linear motor generates electromagnetic force (traditionally called Lorentz force) on a moving linear coil array in cooperation with a stationary magnet array to propel a moving stage attached to the coil array. Alternatively, a linear motor can have a stationary coil array and a moving magnet array attached to a stage.

FIG. 1a is an isometric view of a typical magnet array 100 currently used in linear motors. Magnet array 100 includes a base rail 102 and two side rails, e.g. a right side rail 104 and a left side rail 106, which are attached to base rail 102 by screws 108 to form a "U" shaped yoke 114 containing an open channel 116. Full size magnets 110 and short magnets 112 are attached to side rails 104 and 106 to provide magnet pairs, which face each other across channel 116. Short magnets 112 are positioned adjacent the open ends of yoke 114 and full size magnets 110 are typically equally spaced along each side rail 104, 106 between respective short magnets 112. The magnets of each magnet pair have parallel magnetic polarities. Adjacent magnet pairs have oppositely directed magnetic polarities.

Base rail 102 is of non-magnetic material, such as 304 stainless steel, aluminum or ceramic. Side rails 104 and 106 are of magnetic material (e.g. iron or steel) typically with saturation flux density equal to or greater than about 16,000 gauss. Full size magnets 110 and short magnets 112 are of e.g. high quality neodymium iron boron (NdFeB) permanent magnet material with a residual permanent magnetic flux density of about 13,500 gauss or greater. The magnets are typically coated to prevent corrosion.

Conventionally, a linear motor includes a coil array (not shown), located in channel 116. The coil array generates an electromagnetic force in cooperation with magnet array 100.

Such a conventional linear motor has several disadvantages, one of the which is low efficiency. Additionally, massive side rails of iron or other magnetic material are required to complete the magnetic flux circuit. These side rails can add undesired weight to a moving magnet array.

Trumper et al., "Magnet Arrays for Synchronous Machines," Proc. of IEEE Industry Application Society Annual Meeting Oct. 2–8, 1993 (IEEE CAT93CH3366, vol. 1 of 3 vols.) describes a Cartesian Halbach magnet array design (see also Halbach "Design of Permanent Multipole Magnets with Oriented Rare Earth Cobalt Material," Nuclear Instruments and Methods, 169, 1980, pp. 1–10; "Physical and Optical Properties of Rare Earth Cobalt Magnets," Nuclear Instruments and Methods, 187, 1981, pp. 109–117).

FIG. 1b is a schematic view of a Cartesian Halbach array 150, as described by Trumper et al., cited above. Halbach array 150 contains a row of abutting permanent magnets 152a–152g of alternating orthogonal polarity, as shown by arrows in each block of FIG. 1b. Halbach array 150 has a spatial period D152 equal to the widths of four magnets 152a–152d, in which the magnetic polarity rotates stepwise by 90 degrees per magnet through a full angle of 360 degrees. For example, magnets 152a and 152e (which is one spatial period D152 or four magnet widths displaced from magnet 152a) have the same magnetic polarity. The thickness D150 of Halbach array 150 is equal to one quarter of spatial period D152.

The magnetic flux circuit of Halbach array 150 is completed through the magnets 152a–152g, such that no iron or other magnetic material is required for side rails. Magnetic flux is shown by the solid curves in FIG. 1b. It is evident from FIG. 1b that the magnetic flux is substantially higher on a strong side 154 and lower on a weak side 156 of Halbach magnet array 150. When a linear motor is configured with paired Halbach magnet arrays having strong sides 154 facing one another across a channel, then the magnetic flux at the intermediate coil array is advantageously enhanced. Thus the highly asymmetric concentration of magnetic flux in Halbach magnet array 150 provides an improvement in linear motor efficiency relative to conventional magnet array designs, such as that shown in FIG. 1a.

Nevertheless, further efficiency improvements have been sought during more than a decade since the advent of the Halbach design. Clearly needed in the art is a magnet array that provides higher magnetic flux density for a given width of magnet array, relative to the Halbach design. Also needed in the art is a magnet array that provides magnetic flux enhancement without requiring a magnetic side rail, and can therefore use a side rail material with high stiffness and low mass, such as ceramic.

It is accordingly desirable to provide a magnet array for a linear motor having enhanced magnetic flux in a compact configuration, and having flexibility in the selection of side rail materials.

SUMMARY

A wedge magnet array for a linear motor is provided, which can be applied to drive and control a positioning stage, e.g. in a photolithographic instrument. The wedge magnet array has a compact design and is configured for efficient operation.

The wedge magnet array typically includes a conventional "U" shaped yoke attached to a pair of parallel planar side rails separated by a linear open-sided channel, which provides the path for a coil array. A row of aligned permanent magnets is attached to the surface of each side rail facing the channel. The magnets are typically formed of neodymium iron boron (NdFeB) and are typically attached to the side rails by adhesive bonding.

Two magnet types are used: (1) transverse magnets having magnetic polarities aligned parallel to the plane of the side rails, and (2) wedge magnets having magnetic polarities aligned at angles oblique relative to both the side rails and the direction perpendicular to the side rails.

The transverse magnets are spaced at regular intervals along each side rail and are oriented such that consecutive transverse magnets have alternating reversed magnetic polarities. Transverse magnets are paired across the channel, such that transverse magnets directly opposite one another have oppositely directed magnetic polarities and are linked together by a common closed magnetic flux circuit, which is aligned substantially parallel to the magnetic polarity within each transverse magnet of a pair.

Wedge magnets are disposed such that two wedge magnets adjacently flank two sides respectively of each transverse magnet along a direction parallel with the side rail. Thus, along a given side rail two wedge magnets are located between consecutive transverse magnets. The closed magnetic flux circuit linking cross-channel pairs of transverse magnets also passes through and links their associated wedge magnets. The magnetic polarity internal to each such wedge magnet is aligned substantially parallel with the local direction of its respective closed magnetic flux circuit.

A pair of cross-channel transverse magnets together with their four associated wedge magnets and closed magnetic flux circuit form complementary array segments. Complementary array segments are configured such that their respective elements and magnetic polarities are disposed and oriented symmetrically about an axis passing substantially through the center and perpendicular to the plane of the respective closed magnetic flux circuit. Elements and magnetic polarities of longitudinally adjacent array segments are disposed and oriented to form mirror images of one another (are laterally symmetric) about a plane that passes between the adjacent array segments and is perpendicular to the side rail.

Alternative wedge magnet array embodiments include only a single row of transverse and wedge magnets instead of two complementary rows. In these embodiments, the single-sided magnet array is oriented adjacent and parallel to the coil array path.

In some embodiments, the cross-sectional shape of wedge magnets in a plane parallel to their magnetic polarities is rectangular. In other embodiments, the cross-sectional shape of wedge magnets in a plane parallel to their magnetic polarities is trapezoidal, with the slant surface facing the nearest side rail. In these latter embodiments, the spaces between the slant surfaces and the side rail can be filled with a cast polymer. Alternatively, the side rail surface can be made conformal with the slant surfaces and conventionally bonded to them.

Typically a wedge magnet array is cooperatively coupled with a linear coil array to provide a linear motor. In some embodiments, the linear coil array includes polygonal shaped coils. The linear coil array is energized by the application of electric current, generating an electromagnetic force on the coil array in cooperation with the wedge magnet array. The electromagnetic force provides a linear relative motion between the wedge magnet array and the linear coil array. Both moving coil and moving magnet embodiments are enabled.

Magnetic flux circuits are completed directly through the magnets and not through the side rails. Accordingly, side rails need not be formed of a magnetic material, but can instead be formed of a non-magnetic structural material. This freedom of material selection for side rails allows potential weight reduction and strength increase. Further, because the magnetic flux circuit is aligned substantially parallel with the local magnetic polarities within each of the magnets, the magnetic flux is effectively enhanced around the circuit.

By comparison with a Cartesian Halbach array, a wedge magnet array of the present invention provides approximately 10 percent greater magnetic flux density and uses approximately 15 percent less magnetic material to generate that flux density.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent by referencing the accompanying drawings. For simplicity and ease of understanding, common numbering of elements within the illustrations is employed where an element is the same in different drawings.

FIG. 2b is a plan view of a portion of the first single-sided wedge magnet array of FIG. 2a;

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

Figure 2A:
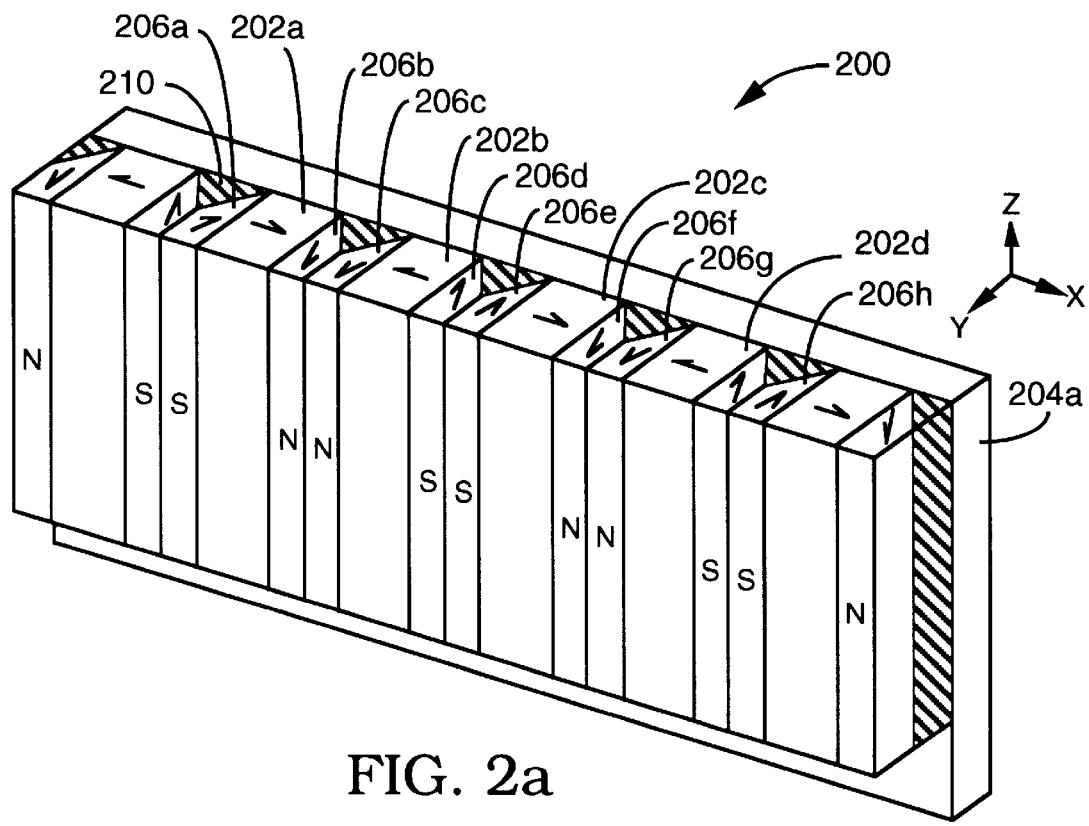
FIG. 2a is an isometric view of one side of a first single-sided wedge magnet array, in accordance with an embodiment of the present invention.
Figure 2B:
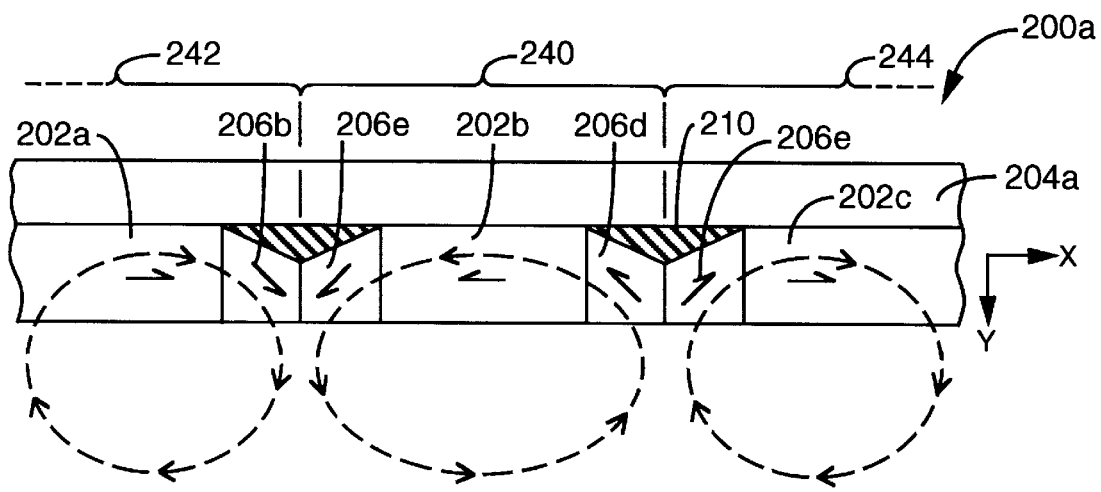
Figure 2C:
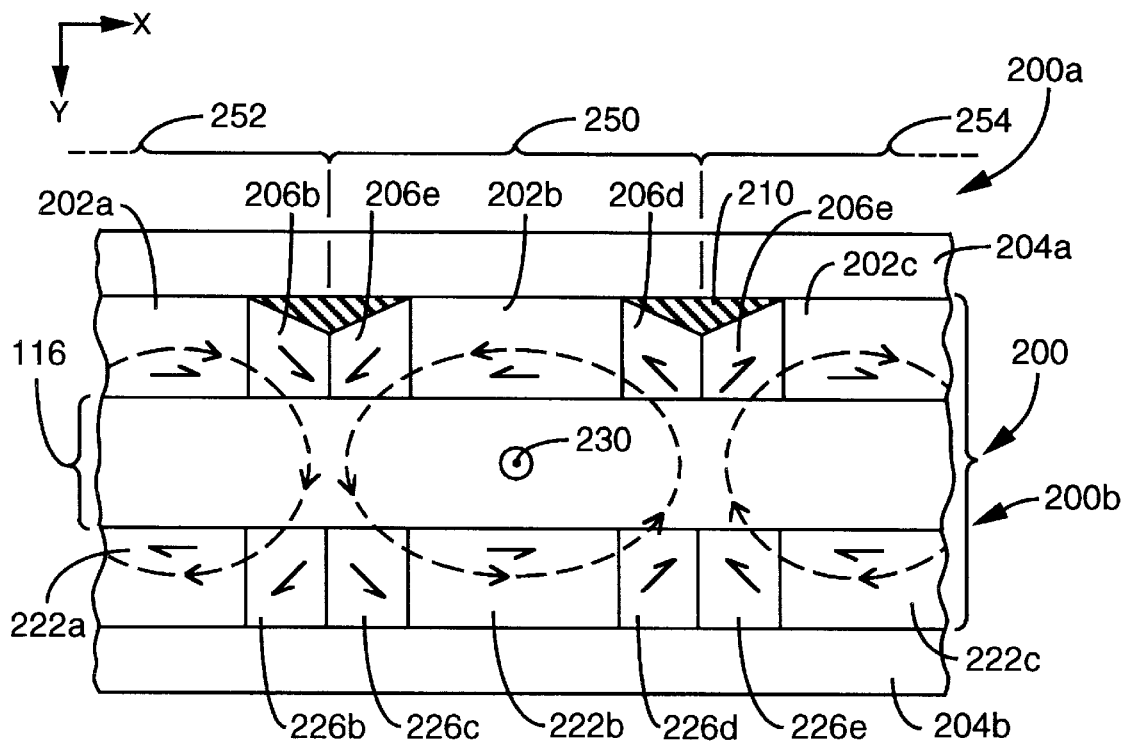
FIG. 2c is a plan view of a portion of a two-sided wedge magnet array, including a portion of a first single-sided wedge magnet array and a portion of a second single-sided wedge magnet array.

FIG. 2a is an isometric view of a first single-sided wedge magnet array 200a, in accordance with an embodiment of the present invention. FIG. 2b is a plan view of a portion of first single-sided wedge magnet array 200a. FIG. 2c is a plan view of a portion of a two-sided wedge magnet array 200, including a portion of first single-sided wedge magnet array 200a, as shown in FIG. 2a, and a portion of a second single-sided wedge magnet array 200b. Transverse permanent magnets 202a–202d having alternately reversed magnetic polarities are oriented vertically (parallel to the z-axis, shown in coordinate arrows of FIG. 2a and perpendicular to the plane of FIGS. 2b–2c) and are aligned linearly parallel to the x-axis and are attached to a first side rail 204a, parallel to the xz-plane. Magnetic polarities are shown by arrows on the magnets in FIGS. 2a–2c. The polarities of transverse magnets 202a–202d are oriented parallel to the x-axis. Each transverse magnet 202a–202d is flanked adjacently by two permanent wedge magnets 206a–206h, having magnetic polarities aligned in an xy-plane.

Figure 1A:
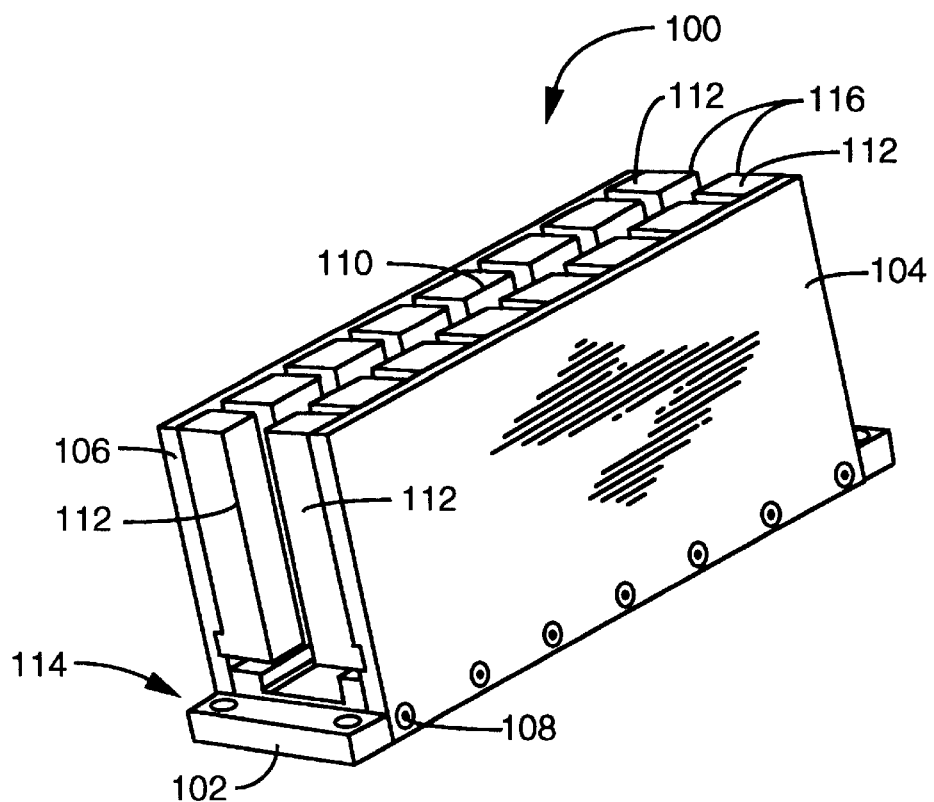
FIG. 1a is an isometric view of a conventional magnet array currently used in linear motors, in accordance with prior art.
Figure 1B:
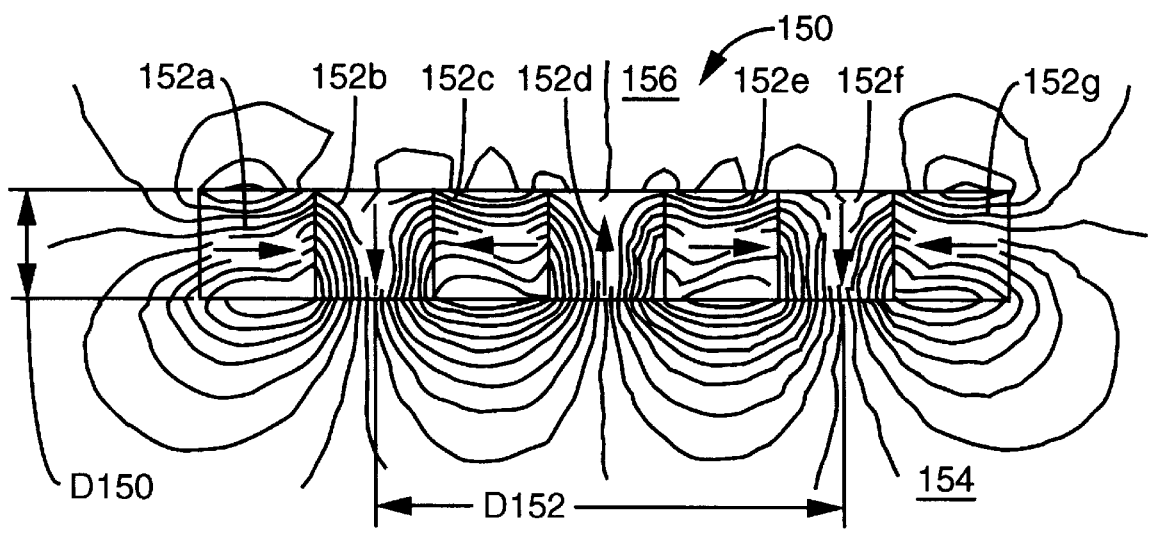
FIG. 1b is a schematic view of a Cartesian Halbach array, in accordance with prior art.

Referring to FIG. 2c, transverse magnets 222a–222c and wedge magnets 226b–226e, attached to a second side rail 204b of second single-sided wedge magnet array 200b, are configured similarly to respective transverse magnets 202a–202c and wedge magnets 206b–206e of first side 200a. Magnets on first side rail 204a face the corresponding magnets on second side rail 204b across an open channel 116. Magnets typically are neodymium iron boron (NdFeB) permanent magnets, as described above in connection with FIG. 1a.

The broken lines in FIGS. 2b and 2c trace the magnetic flux paths. In the single-sided wedge magnet array of FIG. 2b, an array segment, defined by a transverse magnet and its two flanking wedge magnets, is linked by a closed magnetic flux circuit. For example, an array segment 240, containing transverse magnet 202b and flanking wedge magnets 206c and 206d, is linked by a closed magnetic flux circuit. Adjacent array segment 242, containing transverse magnet 202a and wedge magnets 206a and 206b, is likewise linked by its individual closed magnetic flux circuit.

In the two-sided wedge magnet array of FIG. 2c, paired transverse magnets located directly across channel 116 from one another on side rails 204a and 204b have opposite magnetic polarities, and are linked by a closed magnetic flux circuit. For example, paired transverse magnets 202b and 222b, located directly across channel 116 from one another on side rails 204a and 204b respectively, have opposite magnetic polarities and are linked by a single closed magnetic flux circuit.

Wedge magnets 206b–206e and 226b–226e have magnetic polarities substantially aligned with the local magnetic flux circuits linked with their respective flanked transverse magnets. For example, the magnetic polarities of wedge magnets 206d and 226d of FIG. 2c are substantially aligned with the magnetic flux circuit linking transverse magnets 202b and 222b.

As illustrated in FIGS. 2a–2c, wedge magnets 206a–206h and 226b–226e have internal magnetic polarities oriented intermediate between the magnetic polarity of their respective flanked transverse magnet (parallel to the x-axis) and the y-direction (perpendicular to side rails 204a, 204b). The y-direction magnetic polarity component of the wedge magnets creates an array of north (N) and south (S) magnet poles on the wedge magnet faces distal to respective side rails 204a, 204b, as illustrated in FIG. 2a. The x-direction magnetic polarity component of the wedge magnets provides efficient coupling of magnetic flux and a closed magnetic flux circuit between the transverse magnets and channel 116.

Referring to FIG. 2c, each closed magnetic flux circuit is occupied by a pair of transverse magnets having opposite polarity and by four associated flanking wedge magnets. This magnetic flux and polarity configuration defines a two-sided array segment. The individual magnetic polarities of the associated transverse and wedge magnets in an array segment are arranged with substantially uniaxial symmetry about a z-direction axis passing substantially through the geometric center of the closed magnetic flux circuit. For example, z-direction axis 230 passes substantially through the geometric center of the magnetic flux circuit occupied by transverse magnets 202b, 222b and associated wedge magnets 206c, 206d, 226c, 226d, which define an array segment 250. The magnetic polarities of transverse magnets 202b and 222b are symmetric with one another about axis 230. Likewise the magnetic polarities of wedge magnets 206c, 226d, and those of wedge magnets 206d, 226c respectively are symmetric with one another about axis 230.

The magnets on opposite sides of an array segment, such as segment 250 of two-sided wedge magnet array 200, are complementary in the sense that they share in completing a common closed magnetic flux circuit and their respective magnetic polarities are disposed symmetrically about a polar axis.

Of importance, the magnetic flux circuits of array segments, such as array segment 250 of two-sided wedge magnet array 200 in FIG. 2c, are completed directly through transverse magnets 202a–202c, 222a–222c and wedge magnets 206b–206e, 226b–226e and not through side rail portions 204a, 204b. Likewise, the magnetic flux circuits of single-sided array segments, such as array segment 240 of FIG. 2b are completed directly through transverse magnets 202a–202c and wedge magnets 206b–206e. This allows freedom of material selection for side rails, providing potential weight reduction and strength increase. For example, side rails need not be formed of a magnetic material, but can be formed of a non-magnetic structural material, such as 304 stainless steel, aluminum, ceramic, rigid polymer, or composite. Because the magnetic flux circuit is aligned substantially parallel with the local magnetic polarities within the magnets, the flux is effectively enhanced along the magnetic flux circuit through transverse magnets each having paired wedge magnets.

In some embodiments, as illustrated in FIG. 2c, two-sided wedge magnet array 200 includes a plurality of array segments, such as array segments 250, 252, and 254, adjacent one another along the x-direction. As is evident in FIG. 2c, magnetic flux and magnetic polarities of two longitudinally adjacent array segments are respectively mirror images of one another about a yz-plane. For example, transverse magnets 202c and 222c of array segment 254 have magnetic polarities oriented along directions that are substantially mirror images about a yz-plane of respective magnetic polarities of transverse magnets 202b and 222b of adjacent array segment 250. Similarly, the magnetic polarities of wedge magnets 206e and 226e of array segment 254 are oriented along directions that are substantially mirror images about a yz-plane of respective magnetic polarities of wedge magnets 206d and 226d of array segment 250.

In some embodiments, as illustrated in FIGS. 2a and 2b, single-sided wedge magnet array 200a includes a plurality of array segments, such as array segments 240, 242, and 244, adjacent one another along the x-direction. As is evident in FIG. 2b, magnetic flux and magnetic polarities of two longitudinally adjacent array segments are respectively mirror images of one another about a yz-plane. For example, transverse magnet 202c of array segment 244 has a magnetic polarity oriented substantially mirroring the magnetic polarity of transverse magnet 202b of adjacent array segment 240 across a yz-plane separating array segment 240 from array segment 244. Similarly, the magnetic polarity of wedge magnet 206e of array segment 244 is oriented substantially mirroring the magnetic polarity of wedge magnet 206d of array segment 240 across a yz-plane separating array segment 240 from array segment 244.

In some embodiments, wedge magnets have a rectangular cross-section, as illustrated by wedge magnets 226b–226e on side rail 204b of FIG. 2c. In such embodiments, wedge magnets and/or transverse magnets are typically bonded directly to the adjacent side rail, using a conventional adhesive, such as an epoxy adhesive, from 3M Co., Minneapolis, Minn. or other commercial manufacturer.

In other embodiments, wedge magnets are configured as trapezoidal prisms, as illustrated by wedge magnets 206b–206e of FIGS. 2a and 2b. Although rectangular and trapezoidal wedge magnets are not typically mixed within a wedge magnet array, for convenience of illustration trapezoidal wedge magnets 206b–206e are shown on side rail 204a and rectangular wedge magnets 226b–226e on side rail 204b in FIG. 2b. The magnetic properties of the trapezoidal and rectangular configurations are substantially identical. The trapezoidal configuration, however, offers the potential of some weight reduction relative to the rectangular configuration, with a trade-off of somewhat greater manufacturing complexity. The triangular spaces between the slanted magnet sides and the adjacent side rail can be filled with a cast polymer resin 210, such as an epoxy resin, available from 3M Co., Minneapolis, Minn., or other commercial manufacturer. Alternatively, the adjacent side rail can be configured to fill the spaces behind the slanted sides, thus providing a conformal surface integral with the side rail to which the slanted sides are typically bonded by an appropriate adhesive, such as an epoxy adhesive from 3M Co., Minneapolis, Minn., or other commercial manufacturer. Transverse magnets typically are conventionally bonded to their respective adjacent side rails, as described above.

Figure 3A:
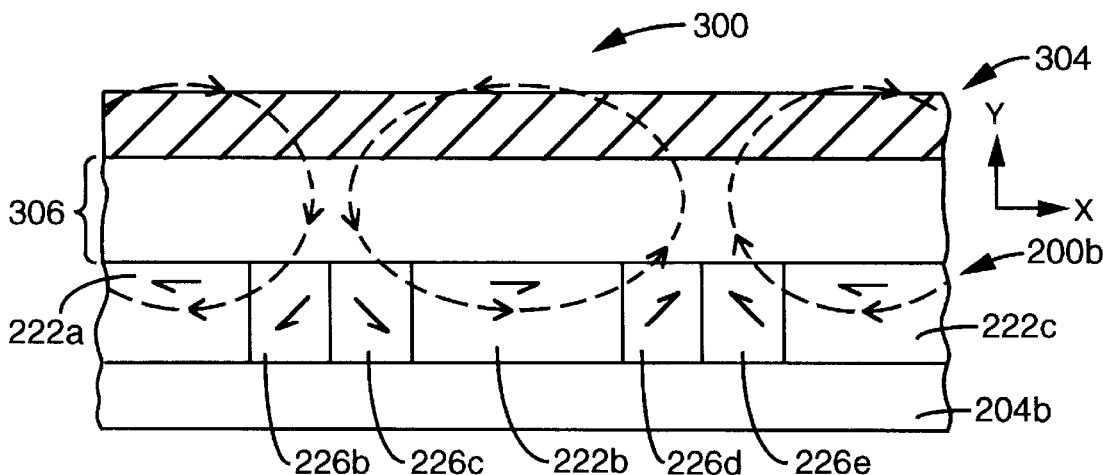
FIG. 3a is a plan view of a portion of a linear motor incorporating a single-sided wedge magnet array, as shown in FIG. 2b.

FIG. 3a is a plan view of a portion of a linear motor incorporating a single-sided wedge magnet array 200b, as shown in FIG. 2b. A linear coil array 304 passes perpendicular to the plane of the figure, separated from single-sided magnet array 200b by a gap 306.

In operation, linear motor 300 couples a linear coil array 304 with a single-sided wedge magnet array 200b. Linear motor 300 is energized by applying electric current to coil array 304, thereby generating an electromagnetic force on coil array 304 in cooperation with wedge magnet array 200b, as described in Hazelton et al., U.S. patent application Ser. No. 09/059,056, cited above. The electromagnetic force moves wedge magnet array 200b relative to linear coil array 304.

Figure 3B:
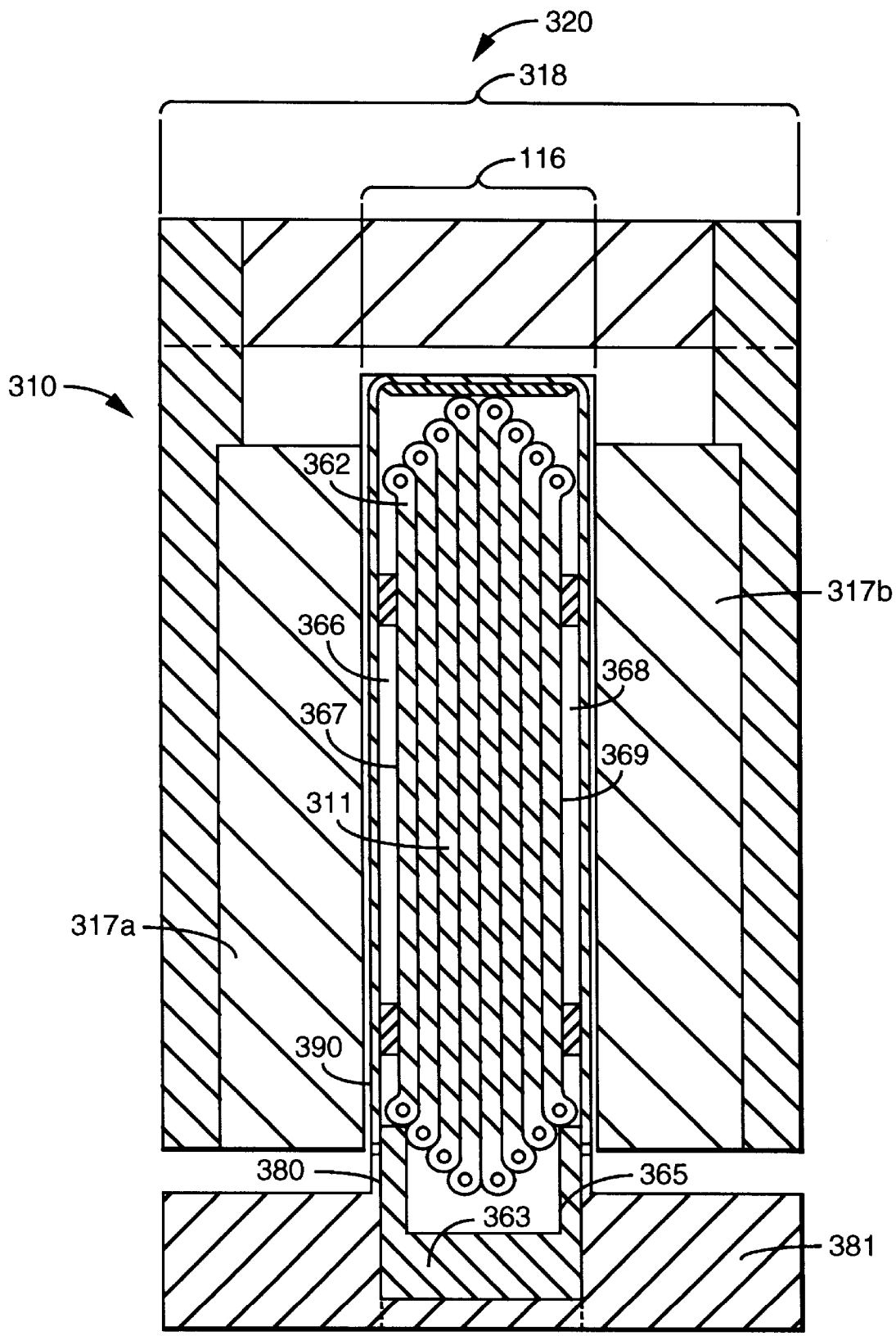
FIG. 3b is a cross-sectional view of a linear motor incorporating a two-sided wedge magnet array of the present invention.

FIG. 3b is a cross-sectional view of a linear motor incorporating a two-sided wedge magnet array of the present invention. A linear motor 320 includes a two-sided wedge magnet array 310 having a yoke 318, which mounts a pair of wedge magnet array sides 317a, 317b similar to single-sided wedge magnet arrays 200a and 200b described above in connection with FIGS. 2a–2c. A linear coil array 311 passes perpendicular to the plane of the figure through a channel 116 between wedge magnet array sides 317a, 317b with a gap 390 therebetween. Coil array 311 can be of conventional design or can be of a polygonal-shaped coil design similar to that described in Hazelton et al., U.S. patent application Ser. No. 09/059,056, cited above. Coil array 311 includes coils 362, such as polygonal coils, which are sealed into an enclosure 363. Typically, eight or more coils are enclosed, the coils being electrically connected in series.

Enclosure 363 is welded or sealed into a block 365, elongated in a direction perpendicular to the plane of the figure. Formed into block 365 are elongated recesses or slots 366 and 368, which extend along outwardly facing opposite sides 367 and 369, respectively, of coils 362. Recesses 366 and 368 have widths and lengths substantially the same as the width and length of coils 362 and can be used as cooling channels. Block 365 has a T-shaped cross-section including a vertical portion 380 and a horizontal cross-piece 381.

Generally, block 365 of coil array 311 is mounted to a stationary surface, and magnet array 310, typically attached to a positioning stage (not shown), moves relative to coil array 311. Alternatively, yoke 318 of magnet array 310 is mounted to a stationary surface, and coil array 311, typically attached to a positioning stage (not shown), moves relative to magnet array 310.

In operation, linear motor 320 couples linear coil array 311 with wedge magnet array 310. Coil array 311 is energized by applying electric current to coils 362, thereby generating an electromagnetic force, on coil array 311 in cooperation with wedge magnet array 310, as described in Hazelton, et al., U.S. patent application Ser. No. 09/059,056, cited above. The electromagnetic force moves wedge magnet array 310 relative to linear coil array 311.

In accordance with the invention, a linear motor includes a linear assembly of coil units in cooperation with a wedge magnet array. The wedge magnet array has a compact design and is configured for efficient operation. By comparison with a Cartesian Halbach array described by Trumper et al., cited above, a wedge magnet array of the present invention provides approximately 10 percent greater magnetic flux density and uses approximately 15 percent less magnetic material to generate this flux. Like a Cartesian Halbach array, a wedge magnet array of the present invention eliminates the need for massive magnetic side rails for magnetic flux circuit completion.

Figure 4:
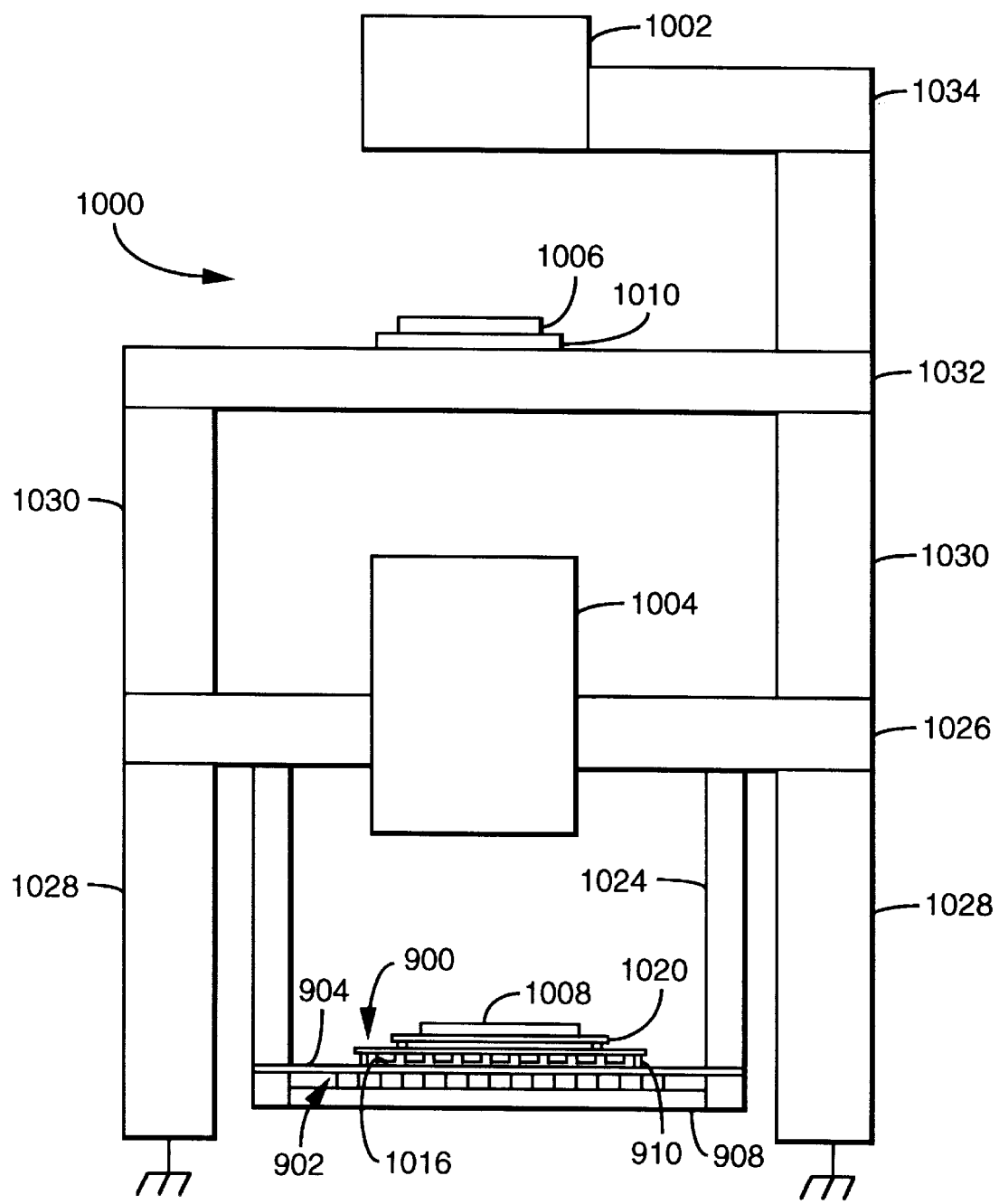
FIG. 4 is a schematic view illustrating a photolithographic instrument incorporating a wafer positioning stage driven by a linear motor in accordance with present invention.

FIG. 4 is a schematic view illustrating a photolithographic instrument 1000 incorporating a wafer positioning stage driven by a linear motor in accordance with present invention. Examples of photolithographic instruments that may incorporate a linear motor of the present invention are described in Hazelton et al., U.S. application Ser. No. 09/168,694, filed Oct. 2, 1998; Nakasuji, U.S. Pat. No. 5,773,837; Nishi, U.S. Pat. No. 5,477,304; Saiki et al., U.S. Pat. No. 5,715,037; and Lee, U.S. Pat. No. 5,528,118; all commonly assigned, the specifications of all of which are incorporated herein by reference in their entirety.

Referring to FIG. 4, photolithographic instrument 1000 generally comprises an illumination system 1002 and a linear motor 900 for wafer support and positioning. Illumination system 1002 projects radiant energy (e.g. light) through a mask pattern (e.g., a circuit pattern for a semiconductor device) on a reticle 1006 that is supported by and scanned using a stage 1010. Reticle stage 1010 is supported by a frame 1032. The radiant energy is focused through a system of lenses 1004 supported on a frame 1026, which is in turn anchored to the ground through a support 1028. Lens system 1004 is also connected to illumination system 1002 through frames 1026, 1030, 1032, and 1034. The radiant energy exposes the mask pattern onto a layer of photoresist on a wafer 1008.

Wafer 1008 is supported by and scanned using a wafer stage 1020 that is in turn supported and positioned by linear motor 900. Motor 900 comprises a moving magnet array 910 and a fixed coil array 902. Alternatively motor 900 comprises a moving coil array and a fixed magnet array. Although photolithographic instrument 1000 is shown as incorporating a linear motor in which a permanent magnet array is attached to the moving stage, the photolithographic instrument can be adapted to incorporate a moving coil linear motor. Wafer stage 1020 and moving magnet array 910 are supported by air bearings 1016 on a top plate 904. The wafer positioning stage assembly, including a base 908, is connected to frame 1026 through frame 1024.

A similar linear motor can be used in reticle stage 1010. Details of the implementation are not shown, but, given the disclosure herein, a person skilled in the art can implement a linear motor in reticle stage 1010 without undue experimentation.

It is to be understood that a photolithographic instrument may differ from the one shown herein without departing from the scope of the invention. It is also to be understood that the application of the linear motor of the present invention as disclosed herein is not to be limited to wafer processing apparatus.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus comprising a magnet array suitable for a linear motor, having a first array segment including:
    a transverse magnet having a magnetic polarity oriented substantially parallel to a first direction; and
    a wedge magnet having a magnetic polarity oriented at an angle to said first direction;
    wherein a closed magnetic flux circuit passes through said transverse magnet and said wedge magnet, having a direction such that the magnetic polarities of said transverse magnet and said wedge magnet are each aligned substantially parallel with the respective local directions of said magnetic flux circuit.

2. The apparatus of claim 1, wherein said transverse magnet and said wedge magnet are permanent magnets.

3. The apparatus of claim 2, wherein said permanent magnets are of neodymium iron boron.

4. The apparatus of claim 1, wherein a cross-sectional shape of said wedge magnet in a plane substantially parallel with said magnetic polarity of said wedge magnet is rectangular.

5. The apparatus of claim 1, wherein a cross-sectional shape of said wedge magnet in a plane substantially parallel with said magnetic polarity of said wedge magnet is trapezoidal.

6. The apparatus of claim 1, further comprising a second array segment adjacent said first array segment along said first direction, said second array segment comprising a second transverse magnet and a second wedge magnet, said second transverse magnet and said second wedge magnet having respective second magnetic polarities, wherein a second closed magnetic flux circuit passes through said second transverse magnet and said second wedge magnet.

7. The apparatus of claim 6, wherein the orientations of said second magnetic polarities and said second closed magnetic flux circuit are substantially laterally symmetric about a plane perpendicular to said first direction to corresponding orientations of the first magnetic polarities and the first closed magnetic flux circuit.

8. The apparatus of claim 1, further comprising a side rail adjacent and attached to said transverse magnet and said wedge magnet.

9. The apparatus of claim 1, further comprising a complementary array segment including:
    a complementary transverse magnet having a magnetic polarity oriented substantially parallel to said first direction; and
    a complementary wedge magnet having a magnetic polarity oriented at an angle to said first direction;
    said complementary array segment being transversely spaced apart from said array segment;
    wherein a complementary closed magnetic flux circuit passes through said complementary transverse magnet and said complementary wedge magnet.

10. The apparatus of claim 9, wherein said magnetic polarities of said transverse magnets and said wedge magnets and of said complementary transverse magnets and wedge magnets are disposed symmetrically about an axis passing substantially perpendicular to the plane of said magnetic polarities.

11. The apparatus of claim 1, further comprising a linear coil array of the linear motor cooperating with said magnet array.

12. The apparatus of claim 11, wherein said linear coil array includes a polygonal shaped coil.

13. A method of making a magnet array suitable for a linear motor, comprising the acts of:
    assembling an array segment including a transverse magnet and a wedge magnet adjacent one another along a first direction, such that the magnetic polarity of said transverse magnet is oriented substantially parallel to said first direction and the magnetic polarity of said wedge magnet is oriented at an angle to said first direction;
    wherein a closed magnetic flux circuit passes through said transverse magnet and said wedge magnet, having a direction such that the magnetic polarities of said transverse magnet and said wedge magnet are each aligned substantially parallel with the respective local directions of said magnetic flux circuit.

14. The method of claim 13, wherein said assembling includes the act of aligning a plurality of said transverse magnets and wedge magnets along said first direction, such that consecutive transverse magnets have alternating reversed magnetic polarities.

15. The method of claim 13, further comprising the act of attaching said transverse magnet and said wedge magnet to a side rail disposed adjacent said transverse magnet and said wedge magnet.

16. The method of claim 13, wherein said transverse magnet and said wedge magnet are permanent magnets.

17. The method of claim 16, wherein said permanent magnets are of neodymium iron boron.

18. The method of claim 13, wherein a cross-sectional shape of said wedge magnet in a plane substantially parallel with said magnetic polarity of said wedge magnet is rectangular.

19. The method of claim 13, wherein a cross-sectional shape of said wedge magnet in a plane substantially parallel with said magnetic polarity of said wedge magnet is trapezoidal.

20. The method of claim 13, further comprising assembling a complementary array segment including the acts of:
    providing a complementary transverse magnet having a magnetic polarity oriented substantially parallel to said first direction;
    assembling a complementary wedge magnet adjacently flanking said complementary transverse magnet along said first direction, said complementary wedge magnet having a magnetic polarity oriented at an angle to said first direction;
    said complementary array segment being transversely spaced apart from said array segment; and wherein a complementary closed magnetic flux circuit passes through said complementary transverse magnet and said complementary wedge magnet.

21. A method of operating a linear motor, comprising:

providing a magnet array, said magnet array comprising an array segment including a transverse magnet and a wedge magnet adjacent one another along a first direction, such that the magnetic polarity of said transverse magnet is oriented substantially parallel to said first direction and the magnetic polarity of said wedge magnet is oriented at an angle to said first direction, wherein a closed magnetic flux circuit passes through said transverse magnet and said wedge magnet, having a direction such that the magnetic polarities of said transverse magnet and said wedge magnet are each aligned substantially parallel with the respective local directions of said magnetic flux circuit;

providing a linear coil array cooperating with said magnet array;

energizing said coil array by applying electric current to said coil array, thereby generating an electromagnetic force on said coil array in cooperation with said magnet array.

22. The method of claim 21, wherein said magnet array further comprises a second array segment adjacent said first array segment along said first direction, said second array segment comprising a second transverse magnet and a second wedge magnet, said second transverse magnet and said second wedge magnet having respective second magnetic polarities, wherein a second closed magnetic flux circuit passes through said second transverse magnet and said second wedge magnet.

23. The method of claim 21, wherein said transverse magnet and said wedge magnet are permanent magnets.

24. The method of claim 23, wherein said permanent magnets are of neodymium iron boron.

25. The method of claim 21, wherein a cross-sectional shape of said wedge magnet in a plane substantially parallel with said magnetic polarity of said wedge magnet is rectangular.

26. The method of claim 21, wherein a cross-sectional shape of said wedge magnet in a plane substantially parallel with said magnetic polarity of said wedge magnet is trapezoidal.

27. The method of claim 21, further comprising providing a complementary array segment including:

a complementary transverse magnet having a magnetic polarity oriented substantially parallel to said first direction; and a complementary wedge magnet having a magnetic polarity oriented at an angle to said first direction, said complementary array segment being transversely spaced apart from said array segment;

wherein a complementary closed magnetic flux circuit passes through said complementary transverse magnet and said complementary wedge magnet.

28. The method of claim 27, wherein said magnetic polarities of said transverse magnets and said wedge magnets of said array segment and said complementary array segment are disposed symmetrically about an axis passing substantially perpendicular to the plane of said magnetic polarities.

29. The method of claim 21, wherein said linear coil array includes a polygonal shaped coil.

30. A photolithographic apparatus comprising:

a projection system;

a stage for carrying an object, the object being one of a mask carrying a pattern to be projected by the projection system or a workpiece to be imaged by said projection system; and a linear motor coupled to said stage for driving the stage, said linear motor including:

a coil array; and a magnet array cooperating with said coil array and comprising an array segment including a transverse magnet having a magnetic polarity oriented substantially parallel to a first direction, said array segment further comprising a wedge magnet having a magnetic polarity oriented at an angle to said first direction;

wherein a closed magnetic flux circuit passes through said transverse magnet and said wedge magnet, having a direction such that the magnetic polarities of said transverse magnet and said wedge magnet are each aligned substantially parallel with the respective local directions of said magnetic flux circuit.

31. The apparatus of claim 30, wherein a cross-sectional shape of said wedge magnet in a plane substantially parallel with said magnetic polarity of said wedge magnet is rectangular.

32. The apparatus of claim 30, wherein a cross-sectional shape of said wedge magnet in a plane substantially parallel with said magnetic polarity of said wedge magnet is trapezoidal.

33. The apparatus of claim 30, wherein said magnet array further comprises a second array segment adjacent said first array segment along said first direction, said second array segment comprising a second transverse magnet and a second wedge magnet, said second transverse magnet and said second wedge magnet having respective second magnetic polarities, wherein a second closed magnetic flux circuit passes through said second transverse magnet and said second wedge magnet.

34. The apparatus of claim 30, wherein said magnet array further comprises a complementary array segment including:

a complementary transverse magnet having a magnetic polarity oriented substantially parallel to said first direction; and a complementary wedge magnet having a magnetic polarity oriented at an angle to said first direction;

said complementary array segment being transversely spaced apart from said array segment;

wherein a complementary closed magnetic flux circuit passes through said complementary transverse magnet and said complementary wedge magnet.

35. The apparatus of claim 34, wherein said magnetic polarities of said transverse magnets and said wedge magnets of said array segment and said complementary array segment are disposed symmetrically about an axis passing substantially perpendicular to the plane of said magnetic polarities.

36. The apparatus of claim 30, wherein said coil array includes a polygonal shaped coil.

* * * * *